US009492815B2

(12) United States Patent
Zhang et al.

(10) Patent No.: US 9,492,815 B2
(45) Date of Patent: Nov. 15, 2016

(54) CHALCOGENIDE GLASS-CERAMICS WITH PHOTOELECTRIC PROPERTIES AND METHOD FOR THE MANUFACTURE THEREOF

(71) Applicants: CENTRE NATIONAL DE LA RECHERCHE SCIENTIFIQUE, Paris (FR); UNIVERSITE DE NANTES, Nantes (FR); UNIVERSITE DE RENNES 1, Rennes (FR)

(72) Inventors: Xianghua Zhang, Cesson-Sevigne (FR); Laurent Calvez, Thorigne-Fouillard (FR); Hong Li Ma, Cesson-Sevigne (FR); Xianping Fan, Hangzhou (CN); Yang Xu, Rennes (FR); Alain Lafond, Saint Herblain (FR)

(73) Assignees: Centre National de la Recherche Scientifique, Paris (FR); Universite de Nantes, Nantes (FR); Universite de Rennes 1, Rennes (FR)

( * ) Notice: Subject to any disclaimer, the term of this patent is extended or adjusted under 35 U.S.C. 154(b) by 0 days.

(21) Appl. No.: 14/409,635

(22) PCT Filed: Jun. 19, 2013

(86) PCT No.: PCT/FR2013/051432
§ 371 (c)(1),
(2) Date: Feb. 10, 2015

(87) PCT Pub. No.: WO2013/190235
PCT Pub. Date: Dec. 27, 2013

(65) Prior Publication Data
US 2015/0196898 A1    Jul. 16, 2015

(30) Foreign Application Priority Data

Jun. 20, 2012   (FR) ..................... 12 55801

(51) Int. Cl.
| C03C 10/16 | (2006.01) |
| B01J 27/122 | (2006.01) |
| C03C 4/00 | (2006.01) |
| C03C 4/14 | (2006.01) |
| C03C 10/00 | (2006.01) |
| H01B 1/06 | (2006.01) |
| B01J 19/12 | (2006.01) |
| B01J 27/057 | (2006.01) |
| B01J 35/00 | (2006.01) |
| C03B 32/02 | (2006.01) |
| C03C 15/00 | (2006.01) |
| C03C 19/00 | (2006.01) |
| H01L 31/0224 | (2006.01) |

(52) U.S. Cl.
CPC ............ B01J 27/122 (2013.01); B01J 19/122 (2013.01); B01J 27/0573 (2013.01); B01J 35/004 (2013.01); C03B 32/02 (2013.01); C03C 4/00 (2013.01); C03C 4/14 (2013.01); C03C 10/00 (2013.01); C03C 10/16 (2013.01); C03C 15/00 (2013.01); C03C 19/00 (2013.01); H01B 1/06 (2013.01); H01L 31/022466 (2013.01); B01J 2219/1203 (2013.01); C03C 2204/00 (2013.01)

(58) Field of Classification Search
CPC .................................. C03C 10/16; H01B 1/06
See application file for complete search history.

(56) References Cited

U.S. PATENT DOCUMENTS 7,547,652 B2 *  6/2009  Zhang ..................... C03C 3/323
                                                              385/142

FOREIGN PATENT DOCUMENTS

| FR | 2857354 A1 | 7/2007 | ............ C03C 10/20 |
| FR | 2967524 A1 | 5/2012 | ............ H01L 35/12 |

OTHER PUBLICATIONS

International Search Report from corresponding International Patent Application No. PCT/FR2013/051432, dated Dec. 17, 2013 (English-language translation provided).
Preliminary Search Report from corresponding French Patent Application No. 1255801, dated Mar. 8, 2013.
Calvez et al., "Glasses and Glass-ceramics based on $GeSe_2$-$Sb_2Se_3$ and Halides for Far Infrared Transmission." Journal of Non-Crystalline Solids 354 (2008) 1123-1127. www.sciencedirect.com.
Grudinkin et al. "Crystallization ability and optical and electrical properties of Ge(Se-Te) and Ge(Se-Te) chalcogenide glassy semiconductors." EBSCO. Semiconductors; Nov. 2011, vol. 45, Issue 11, p. 1462.
Lin et al. "Semiconductor nanostructure-based photoelectrichemical water splitting: A brief review." Department of Chemistry, Merkert Chemistry Center, Boston College. www.sciencedirect.com, 2011.
Calvez, Laurent. "Nouveaux verres et vitroceramiques transparent dans l'infararouge pour l'imagerie thermique." Material Chemistry. Universite Rennes 1, 2006. (English-language translation pp. 88-89 and 119-122 provided.)
Calvez, Laurent. "Nouveaux verres et vitroceramiques transparent dans l'infararouge pour l'imagerie thermique." Material Chemistry. Universite Rennes 1, 2006. (English-language Resume provided.)
Calvez et al. "Preparation and properties of glasses and glass-ceramics based on $GeSe_2$-$Sb_2Se_3$ and halides." Physics and Chemistry of Glasses: European Journal of Glass Science and Technology Part B, vol. 47, No. 2, pp. 142-145, Apr. 2006.

* cited by examiner

Primary Examiner — Karl Group
(74) Attorney, Agent, or Firm — Kusner & Jaffe

(57) ABSTRACT

Chalcogenide glass-ceramic having, for example, the following composition $GeSe_2$—$Sb_2Se_3$—CuI, this glass-ceramic comprising at least one crystalline phase, characterised in that the crystallisation rate and the dimensions of the crystals in the crystalline phase are such that the crystals are substantially in contact with each other in such a way that this crystalline phase has an electrical conductivity greater than or equal to $10^{-4}$ s·cm$^{-1}$ which increases under lighting due to the creation of charge carriers within the crystalline phase.

19 Claims, 12 Drawing Sheets

CHALCOGENIDE GLASS-CERAMICS WITH PHOTOELECTRIC PROPERTIES AND METHOD FOR THE MANUFACTURE THEREOF

RELATED APPLICATIONS

This application is a National Stage of International Application No. PCT/FR2013/051432, filed Jun. 19, 2013, which claims the benefit of French Patent Application No. 1255801, filed Jun. 20, 2012.

FIELD OF THE INVENTION

The invention relates to glass-ceramics based on chalcogenides having photoelectric properties, the production method thereof, and the use of glass-ceramics of this type for photovoltaic or photocatalytic applications.

BACKGROUND OF THE INVENTION

A glass is defined as a non-crystalline solid exhibiting the glass transition phenomenon. It has an amorphous structure due to liquid solidification during synthesis and only has a short-range order. A glass has a low resistance to mechanical shocks due to the presence of defects therein, it is also defined as brittle and fragile. A distinction is made between a plurality of glass families according to the chemical composition thereof: oxide, fluoride, metallic, organic glasses and chalcogenide glasses. These latter are frequently based on sulphur (S), selenium (Se) or tellurium (Te).

Chalcogenide glasses are currently studied for their wide transmission range extending from the visible to the infrared range. They are particularly marketed for thermal imaging. Chalgogenide glasses have relatively weak chemical bonds, giving said glasses poor thermomechanical properties. In order to offset these properties, glass-ceramics have been manufactured by means of a mere heat treatment of chalcogenide glasses. Now considered to be material in their own right, glass-ceramics are defined as composites consisting of crystals within a vitreous matrix. Their mechanical (toughness, hardness, etc.), optical and thermal properties are modified by the creation of crystallites of varied sizes within the structure.

The document WO 2005/005334 describes chalcogenide glass-ceramics exhibiting transparency in the infrared range.

The photoelectric effect consists of creating electron/hole pairs in a material when said material is exposed to illumination. The electrons are excited by a photon flux, due to the illumination, and are then more or less free to move in the structure. The energy of the absorbed photon creates a pair of free carriers: an electron (or photoelectron) in the conduction band and a hole in the valence band. The electron/hole pair then generates an electric current called a photocurrent. The potential applications of the photoelectric effect are numerous. The photocurrent may either be measured for use as detectors (photodiode, photoelectric cell) or collected to supply electricity (photovoltaic cell).

In respect of photovoltaic applications, the material used most at the present time is doped silicon (p and n) which is found in almost 90% of solar panels produced worldwide. However, this material has a relatively low light energy conversion efficiency in relation to the production cost thereof.

In respect of photocatalytic applications, titanium dioxide ($TiO_2$) is currently the most studied photocatalyst. However, this material has a relatively low sunlight absorption rate (approximately 4%) since it has a band gap corresponding to light irradiation in the near UV spectral region.

The document FR-B1-2 831 467 describes a photocatalyst comprising $TiO_2$.

The aim of the invention is particularly to provide a simple, effective and economical solution for the abovementioned problems of the prior art by means of a material suitable for use for photovoltaic and photocatalytic applications and not exhibiting the abovementioned problems of the prior art.

For this purpose, the invention relates to a chalcogenide glass-ceramic whose composition comprises, as a molar %,

| | |
|---|---|
| Ge + Sn + Pb | 3-25 |
| Sb + In + As + Bi | 10-35 |
| Se + Te | 40-65 |
| M | 2-17 |
| X | 2-17 | wherein M is a transition metal such as Cu and X is a halogen such as I, Cl or Br, and the sum of all the molar percentages of the composition is equal to 100, the glass-ceramic comprising at least one crystalline phase, characterised in that the crystallisation rate and the dimensions of the crystals in the crystalline phase are such that the crystals are substantially in contact with each other in such a way that this crystalline phase has an electrical conductivity greater than or equal to $10^{-4}$ s·cm$^{-1}$ which increases under lighting due to the creation of charge carriers within the crystalline phase.

The crystalline phase thus has semiconductor properties, the charge carriers created within the crystalline phase under lighting being movable and inducing the formation of a photocurrent in the glass-ceramic. The lifetime of the charge carriers found in minority is for example typically between 10-20 µs.

The invention thus relates to a material having particularly advantageous photoelectric properties, in particular since it is suitable for generating a relatively strong photocurrent when the material is subjected to light radiation, for example visible. This material does not exhibit the drawbacks of the above-mentioned materials of the prior art in particular as it can absorb wavelengths in the UV and visible range and the production method thereof is relatively simple and inexpensive.

The inventors observed that the electrical properties of a chalcogenide glass may be markedly enhanced due to the formation of crystallites in which the charge carriers are movable. The size of the crystals and the crystallisation rate may be optimised so that the crystals are substantially in contact with each other. This way, the inventors observed a continuous increase in the electrical conductivity of the glass-ceramic as a function of ceramisation time (FIG. 2). In this case, the chalcogenide glass-ceramic is capable of generating movable charge carriers when exposed to light, creating a photocurrent. The crystals generated thus fundamentally change the electrical properties of the initial glasses which are electrical insulators.

In the present application, the term charge carriers denotes a particle carrying an electrical charge (electrons carry a negative charge and holes carry a positive charge). When they move, charge carriers create an electrical charge. In an n-type semiconductor material, the charge carriers found in majority are electrons and the charge carriers found in minority are holes.

The term crystals or crystallites substantially in contact denotes crystals which are in physical contact with each other or which are in the immediate vicinity of each other (the inter-crystal distances are then very small, for example of the order of one nanometer).

So that the charge carriers generated in the glass-ceramic can move in crystals and from crystals to adjacent crystals, it is preferably necessary to prevent the vitreous phase, which is electrically insulating (due to the fact that the charge carriers created are immobile in this phase), from extending between the crystals and thus impeding the mobility of the charge carriers. Each crystal may not be in contact with all the other crystals and all the crystals are not necessarily in contact with at least one further crystal. The glass-ceramic may comprise one or a plurality of crystalline phases, each crystalline phase may comprise a certain quantity of crystals which are in contact with each other and are suitable for generating movable charge carriers and thus a photocurrent. The greater the number of crystals in contact, the higher is the conductivity of the glass-ceramic.

Although chalcogenide glasses are electrically insulating, the chalcogenide glass-ceramics according to the invention thus exhibit a significant electrical conductivity which increase under illumination. This is enabled by a high absorption of visible light by the material, which produces charge carriers susceptible of moving within the crystalline phase. The charge carriers have a long lifetime (typically between 10-20 μs) and do not recombine rapidly, giving the material an increased electrical conductivity when illuminated. The electrical conductivity of the glass-ceramics according to the invention may be between 1 and $10^{-4}$ s·cm$^{-1}$, preferably between $10^{-4}$ and $10^{-1}$ s·cm$^{-1}$, more preferentially between $10^{-3}$ and $10^{-1}$ s·cm$^{-1}$, and for example between $10^{-2}$ and $10^{-1}$ s·cm$^{-1}$.

Controlled crystallisation of chalcogenide glasses thus makes it possible to increase the electrical conductivity thereof and the photoelectric properties thereof significantly. The glass-ceramics according to the invention are thus comparable to semiconductors. Moreover, as explained in detail hereinafter, the glass-ceramic may have n type, p type, or p and n type behaviour.

The same glass-ceramic may comprise a plurality of separate crystalline phases, which may have the same behaviour (p/n) or mutually different behaviours.

The applications of this type of material relate generally to the conversion of solar energy into electrical or chemical energy.

The conversion of solar energy into electrical energy represents the photovoltaic effect. Chalcogenide glass-ceramics have the advantage of having a direct band gap (between 1 and 2 eV approximately) and thus relatively high light absorption coefficients. Moreover, they may be processed in the form of a thin layer (thickness in the region of 1 to 2 μm for example), which reduces the amount of material used.

Moreover, the charge carriers generated within the glass-ceramic may be p type, n type, or p and n type. The chalcogenide glass-ceramics according to the invention may thus be equipped with p-n junctions, particularly useful for producing photovoltaic solar cells for example.

The conversion of solar energy into chemical energy represents the photocatalytic effect. The chalcogenide glass-ceramics according to the invention have the advantage of having a high chemical stability.

The chalcogenic glass-ceramic according to the invention may have one of the following compositions: $GeSe_2$—$Sb_2Se_3$—CuI; $SnSe_2$—$Sb_2Se_3$—CuI; $PbSe_2$—$Sb_2Se_3$—CuI; $GeSe_2$—$As_2Se_3$—CuI; $GeSe_2In_2Se_3$—CuI; $GeSe_2$—$Bi_2Se_3$—CuI; $GeTe_2$—$Sb_2Se_3$—CuI; $GeSe_2$—$Sb_2Se_3$—CuCl and $GeSe_2$—$Sb_2Se_3$—CuBr.

The composition of the glass-ceramic according to the invention comprises for example, as a molar %,

| | |
|---|---|
| Ge | 3-25 |
| Sb | 10-35 |
| Se | 40-65 |
| Cu | 2-17 |
| I | 2-17 | the sum of all the molar percentages of the composition being equal to 100.

The glass-ceramic may be free from one or a plurality of the following elements: Ga, Ge, S, Cs, Zn, Cd, Rb, Na, K, B and La. Some of these elements may not be used due to their toxicity (such as Cd) and others due to the rarity and thus their cost (such as Ge, In, Ga).

In one embodiment of the invention, the glass-ceramic has the following composition $GeSe_2$—$Sb_2Se_3$—CuI, wherein the respective molar percentages are:

| | |
|---|---|
| $GeSe_2$ | 30-50, preferably 35-45, and for example 40 |
| $Sb_2Se_3$ | 30-50, preferably 35-45, and for example 40 |
| CuI | 10-30, preferably 15-25, and for example 20 |

The crystallisation rate (which may be defined as being the ratio of the total volume occupied by the crystals or crystallites over the volume of the crystalline phase of the glass-ceramic) of the crystalline phase may be greater than 50%, preferably greater than 70%, and more preferentially greater than or equal to 80%, in volume. The crystallisation rate may be between 50 and 100%, preferably between 60 and 95%, more preferentially between 70 and 90%, and for example between 80 and 90%.

The crystals of the crystalline phase may have a mean diameter between 0.1 μm and 10 μm, preferably between 0.5 and 5 μm, and more preferentially between 1 and 3 μm. In the case wherein the crystals have an elongated shape (for example needle-shaped), their length may be between 0.1 and 10 μm, and preferably between 1 and 5 μm. The form factor of the crystals may have an influence on their content and their size in the crystalline phase, in order for the crystals to be substantially in contact with each other and to enable the crystalline phase to have the abovementioned photoelectric properties.

The present invention also relates to a method for producing a glass-ceramic, from a chalcogenide glass wherein the composition comprises, as a molar %,

| | |
|---|---|
| Ge + Sn + Pb | 3-25 |
| Sb + In + As + Bi | 10-35 |
| Se + Te | 40-65 |
| M | 2-17 |
| X | 2-17 | wherein M is a transition metal, such as Cu, and X is a halogen, such as I, Cl or Br, and the sum of all the molar percentages of the composition is equal to 100, characterised in that it comprises a step of subjecting the glass to a heat treatment the duration, and time whereof are determined to create at least one crystalline phase in the glass, the crystallisation rate and the dimensions of at least some crystals of the crystalline phase being such that the crystals are substantially in contact with each other in such a way that this crystalline phase has an electrical conductivity greater than $10^{-4}$ s·cm$^{-1}$, which increases under lighting due to the creation of charge carriers within the crystalline phase.

The method according to the invention may comprise one or a plurality of the following additional steps:
  i) selective chemical etching of the glass-ceramic with a view to increasing the specific surface area thereof; and
  ii) grinding of the glass-ceramic, which makes it possible to increase the specific surface area thereof considerably.

The increase in the specific surface area of a glass-ceramic makes it possible to increase the surface area of the glass-ceramic, which may be exposed to illumination, which enhances the photocatalytic efficiency. This increase in the specific surface area may be produced by selective chemical etching of the glass-ceramic surface making use of a difference in solubility between the crystalline and vitreous phases, thus creating a nanoporous surface.

The duration of the heat treatment may be dependent on the treatment temperature. It is for example between 1 and 15 hours and preferably between 3 and 6 hours. The temperature of the heat treatment is for example greater by more than 10° C., preferably by more than 30° C., and more preferentially by at least 50° C. than the glass transition temperature (Tg) of the glass. The temperature of the heat treatment may be between Tg+10° C. and Tg+150° C., preferably between Tg+20° C. and Tg+100° C., more preferentially between Tg+40° C. and Tg+70° C.

The duration of the heat treatment may be greater than 1 hour, preferably greater than 2 hours, and more preferentially greater than 3 hours so that the crystalline phase can generate a p and n type photocurrent. The duration of the heat treatment may be between 1 and 10 hours, preferably between 2 and 8 hours, and more preferentially between 3 and 6 hours. The invention further relates to the use of a glass-ceramic as described above, for producing electricity by means of the photovoltaic effect, or for decomposing or processing a chemical or biological substance by means of the photocatalytic effect, and in particular decomposing pollutants, hydrogen generation, $CO_2$ reduction.

The invention finally relates to a product chosen from a photovoltaic cell, means for decomposing or processing a chemical or biological substance such as a pollutant, water or $CO_2$, characterised in that it comprises at least one glass-ceramic as described above.

Numerous publications describe in detail the principle of water decomposition for hydrogen production (see for example *Semiconductor nanostructure-based photoelectrochemical water splitting: A brief review* de Yongjing Lin et al., Chemical Physics Letters 507 (2011) 209-215).

BRIEF DESCRIPTION OF THE DRAWINGS

The invention will be understood more clearly and further details, features and advantages of the present invention will emerge more clearly on reading the following description by way of non-limiting example with reference to the appended figures wherein.

DETAILED DESCRIPTION OF THE PREFERRED EMBODIMENTS

Figure 1:
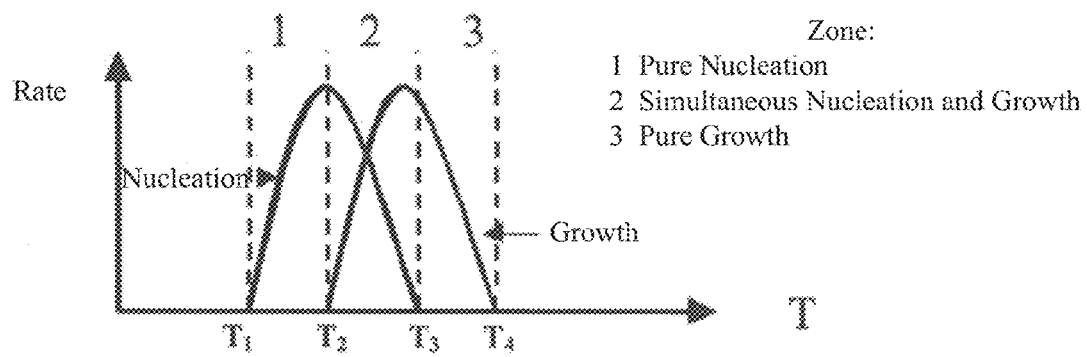
FIG. 1 is a graph representing the progression of the nucleation rate and the growth rate of crystallites of a glass-ceramic as a function of temperature (T)

Hereinafter, a glass-ceramic and a ceramised glass are two expressions to denote the same material obtained by ceramising a glass having the same composition.

The chalcogenide glasses contain at least one chalcogenic element, such as S, Se, or Te. The elements S and Se are susceptible of vitrifying individually and are consequently excellent glass-forming compounds. These elements are generally associated with one or a plurality of further elements such as silicon, germanium, gallium, or pseudochalcogenic elements such as arsenic, antimony, bismuth with the aim of enhancing some properties according to the envisaged applications.

Chalcogenide glasses have the particularity of being transparent in the far infrared range. As a general rule, chalcogenide glasses containing sulphur are transparent from the visible range to 11 µm and display shades ranging from yellow to red. On the other hand, glasses containing selenium or tellurium are not generally transparent in the visible range and are characterised by a black appearance with a metallic sheen.

Glasses based on Se or tellurium have a band gap width less than 1.4 eV.; they absorb all the electromagnetic waves from the visible and UV range. The glasses obtained may transmit up to 15 µm for selenides and to more than 20 µm for tellurium glasses.

With a view to determining whether they have semiconductor properties, electrical conductivity measurements were made on the glasses. These measurements were made using the so-called "four-point" method, well known to those skilled in the art. The principle of this technique consists of passing a direct current through the sample using a current source and measuring on two further contacts the difference in potential using a multimeter.

The apparatus used is not suitable for determining precisely resistances greater than $10^7$ Ω·cm. The inventors checked that chalcogenide glasses based on selenium are electrical insulators. Glasses mostly containing tellurium, such as for example $Te_{75}Ge_{15}Ga_{10}$ may be semiconductors and may produce a weak photocurrent.

Chalcogens have a non-negligible equilibrium vapour pressure when molten. For this reason, chalcogenide glasses are generally synthesised in a vacuum-sealed silica tube, which is well known to those skilled in the art. The synthesis of the chalcogenide glasses was performed in a silica assembly in a vacuum in order to avoid the contamination of the initial products by oxygen or by impurities. A vacuum trap filled with nitrogen is used to condense any volatile products and to enhance the vacuum. The raw materials are heated slowly (2° C./min) up to a temperature of 830° C. and maintained at this temperature for some ten hours so as to homogenise the mixture well. The temperature is then lowered to 750° C. and the reaction mixture is quenched in water at ambient temperature. In order to reduce the internal stress of the glass, the glass is annealed at a temperature close to the glass transition temperature thereof for a few hours. The glass is finally cooled slowly to ambient temperature and then removed from the silica tube.

Associated with the transmission range thereof, these glasses have relatively weak chemical bonds resulting in mediocre thermomechanical properties compared to oxide glasses for example. One of the techniques for enhancing these properties is that of manufacturing composite materials such as glass-ceramics.

It may be difficult to obtain glass-ceramics from a highly covalent chalcogenide glass. Incorporating ionic compounds in the glass composition makes it possible to solve this problem so as to be able to control the nucleation and crystalline growth.

Example 1

Study of GeSe2-Sb2Se3-CuI System

Chalcogenide glasses based on Ge, Se and Sb and containing copper iodide were studied (xGeSe2-ySb2Se3-zCuI). It has emerged that adding copper in CuI form makes it possible to obtain a wide vitreous range. The result was confirmed by introducing up to 38% molar of CuI in the binary diagram GeSe2-Sb2Se3. It is well known that the vitreous range may be extended considerably with a faster quenching speed. One of the reasons for introducing Cu+ into the glass lies in the possibility of obtaining a photosensitive material and that metal particles can precipitate with laser illumination for example.

The thermal analyses demonstrate that these glasses have a low resistance to crystallisation when the CuI content increases, with frequently a difference between the crystallisation and glass transition temperatures ΔT=Tx−Tg less than 100° C. (Table 1 hereinafter). However, since copper is relatively unstable in the $Cu^+$ form thereof, it is difficult to determine the degree of oxidation of this element in the glass. The inventors observed that the glass transition temperature decreases when the CuI content increases. It is highly likely that copper is not inserted in the vitreous lattice and that it plays a compensatory role in respect of the electrical charge of some seleniums present in $Se^-$ form.

TABLE 1

Characteristic temperatures of xGeSe2—ySb2Se3—zCuI compositions

| Composition | | | | | Tx − Tg |
| --- | --- | --- | --- | --- | --- |
| GeSe2 | Sb2Se3 | CuI | Tg (° C.) | Tx (° C.) | (° C.) |
| 40 | 50 | 10 | 223 | 315 | 92 |
| 50 | 40 | 10 | 231 | 358 | 127 |
| 60 | 30 | 10 | 240 | — | — |
| 70 | 20 | 10 | 254 | 383 | 129 |
| 20 | 60 | 20 | 195 | 284 | 89 |
| 30 | 50 | 20 | 208 | 301 | 93 |
| 40 | 40 | 20 | 209 | 294 | 85 |
| 50 | 30 | 20 | 217 | 270 | 53 |
| 60 | 20 | 20 | 244 | 300 | 56 |
| 20 | 50 | 30 | 194 | 277 | 83 |
| 30 | 40 | 30 | 195 | 254 | 59 |

The glasses selected for the study have a Tg greater than 200° C. and have a difference between the crystallisation temperature Tx and Tg greater than 100° C. It is generally acknowledged that the glasses having a ΔT greater than 100° C. are considered to be sufficiently stable to be suitable for shaping by fibre drawing or hot pressing. The heat treatment duration and temperature for partially crystallising the glass are determined according to the stability of the sample and according to the size of the crystals to be obtained. The glass-ceramics are cooled in ambient air before undergoing annealing at 10° C. below Tg so as to reduce the mechanical stress within the vitreous matrix. An example of nucleation and growth rate is given in FIG. 1, the control of this rate being well known to those skilled in the art.

The method used most in the industrial sector consists of performing a nucleation stage at a temperature slightly greater than Tg followed by a second so-called growth stage, this technique is possible when the glass nucleation and crystal growth temperature have been previously determined by means of a thermodynamic study.

The glasses selected during the vitreous diagram study underwent a heat treatment from 10 to 20° C. above Tg according to periods varying from 1 to 5 hours. The inventors observed that short annealing times induce a very slight shift in the start of transmission and high transmission losses towards long wavelengths. These transmission losses, only noted for ceramised glasses and regardless of the treated composition, increase from a wavelength of 2 μm. These transmission losses are similar to those obtained in GaSb type III-V semiconductors. The transmission losses are herein induced by the presence of free charge carriers.

Figure 2:
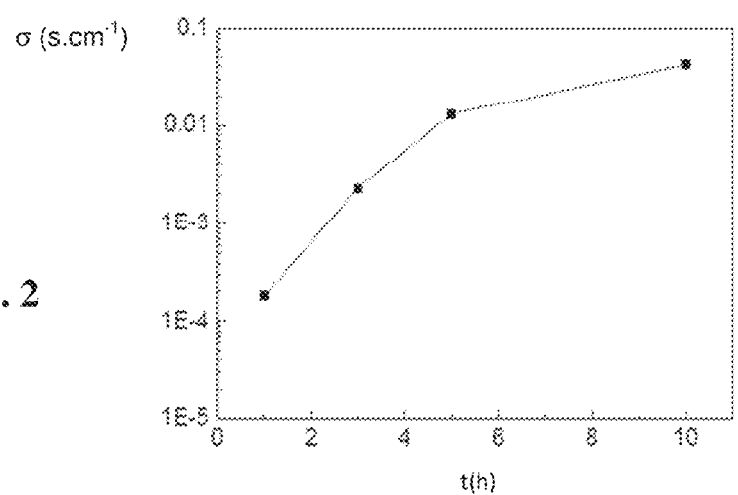
FIG. 2 is a graph representing the electrical conductivity (σ) of a chalcogenide glass-ceramic according to the invention as a function of the duration (t) of a heat treatment at 250° C. for a specific composition.

During the abovementioned experiments on chalcogenide glass-ceramics based on GeSe2-Sb2Se3, the inventors observed that introducing copper iodide (CuI) into the compositions gives rise to an unusual optical transmission which decreases when the wavelength increases, suggesting the existence of free charge carriers in the material. The inventors thus chose to study the glasses of this system in more detail and the electrical response thereof under the effect of illumination in the visible range. Although the initial glass is electrically insulating, the inventors observed that the electrical conductivity increases very rapidly as a function of the glass-ceramic ceramisation time, as represented in FIG. 2.

The electrical conductivity was measured using the four-point method on polished samples. An electric current of 2 nA to 2000 mA was applied on the glass. The inventors measured the voltage and, by applying modified Ohm's law, determined the conductivity thereof:

$$\rho = 4.5325 \times \frac{V}{I} \times e \qquad \sigma = \frac{1}{\rho}$$

where ρ is the resistivity (Ω·cm), V is the voltage measured (V), I is the current applied (A), e is the sample thickness (cm), σ is the conductivity ($\Omega^{-1} \cdot cm^{-1}$) and 4.5325 is a constant associated with the apparatus.

It is noted in FIG. 2 that the glass-ceramic conductivity is greater than $10^{-4}$ s·cm$^{-1}$ after one hour of heat treatment at 250° C., and greater than $10^{-2}$ s·cm−1 after 5 hours of treatment.

Example 2

Study of a First Run of Glasses Having the Composition 50GeSe$_2$-50Sb$_2$Se$_3$+yCuI Transmission spectra were recorded on glasses from a first run having the composition 50GeSe$_2$-50Sb$_2$Se$_3$+yCuI so as to study the optical properties thereof. The transmission measurements were made over a range of wavelengths from 750 nm to 2000 nm using a Perkin-Elmer-Lambda 1050 spectrometer. The transmission spectrum in the MIR and the FIR was produced with an FT-IR Bruker T37 spectrometer. The samples are measured in the form of 1 to 2 mm thick polished chips.

The band gap wavelengths and the associated energies thereof are contained in table 2. The band gap of each glass was calculated on the basis of the Beer-Lambert law.

TABLE 2

Chalcogenide glass band gap values

| Run | Composition (% molar) | | | | |
|---|---|---|---|---|---|
| y | $GeSe_2$ | $Sb_2Se_3$ | CuI | $\lambda_0$ (nm) | $E_0$ (eV) |
| 0.1 | 45 | 45 | 10 | 922 | 1.34 |
| 0.2 | 40 | 40 | 20 | 945 | 1.31 |
| 0.3 | 35 | 35 | 30 | 985 | 1.26 |

It can be noted that the band gap value is shifted towards the longer wavelengths when the proportion of CuI increases. The gap between the conduction band (CB) and the valence band (VB) decreases, from 1.34 eV (10% CuI) to 1.26 eV (30% CuI). Indeed, when copper and iodine, which are electron-rich elements, are added, the gap between the VC and the BC tends to decrease. Increasing the proportion of CuI tends to increase the semiconductor nature of the glasses.

The various characteristic temperatures of the glasses were measured and contained in table 3 so as to study the thermomechanical properties thereof. The characteristic temperatures of the glasses were measured by differential scanning calorimetric (DSC) analysis using the TA Q20. All the measurements were made within a temperature range between 20° C. and 450° C., at a heating rate of 5° C./min and on solid samples having a mass between 5 mg and 10 mg. The analyses were conducted with inert gas ($N_2$) scavenging to prevent any reaction of the material with the furnace atmosphere.

TABLE 3

Characteristic temperatures as a function of CuI content

| Run | Composition (% molar) | | | Characteristic temperatures | | |
|---|---|---|---|---|---|---|
| Y | $GeSe_2$ | $Sb_2Se_3$ | CuI | $T_g$ | $T_x$ | $\Delta T$ |
| 0 | 50 | 50 | 0 | 247 | 353 | 106 |
| 0.1 | 45 | 45 | 10 | 220 | 324 | 104 |
| 0.2 | 40 | 40 | 20 | 213 | 285 | 72 |
| 0.3 | 35 | 35 | 30 | 195 | 243 | 48 |

The glass transition temperature (Tg) decreases when the proportion of CuI increases, it varies between 247° C. and 195° C. A decrease of approximately 50° C. between the base glass $GeSe_2$-$Sb_2Se_3$ and the glass having the composition $35GeSe_2$-$35Sb_2Se_3$-$30CuI$ may be observed. These glasses have a low thermal stability, indeed, only two compositions have a value of $\Delta T$ in the region of 100° C. The stability of the glass tends to decrease when the CuI content increases.

Example 3

Study of a Second Run of Glasses Having the Composition $(GeSe_2)_x$-$(Sb_2Se_3)_{(1-x)}$+20CuI A second run of glasses having the composition $(GeSe_2)_x$—$(Sb_2Se_3)_{(1-x)}$+20CuI (where x is between 0.3 and 0.6) was studied to evaluate the impact of the ratio $GeSe_2$/$Sb_2Se_3$ for the same proportion of CuI.

Table 4 shows the results of the transmission measurements made on these glasses. The band gap energy values were calculated on the basis of the wavelengths thereof.

TABLE 4

Band gap values of glasses from the second run

| Run | Composition (% molar) | | | | |
|---|---|---|---|---|---|
| x | $GeSe_2$ | $Sb_2Se_3$ | CuI | $\lambda_0$ (nm) | $E_0$ (eV) |
| 0.3 | 24 | 56 | 20 | 1007 | 1.23 |
| 0.4 | 32 | 48 | 20 | 975 | 1.27 |
| 0.5 | 40 | 40 | 20 | 945 | 1.31 |
| 0.6 | 48 | 32 | 20 | 924 | 1.34 |

A decrease in the wavelength of the band gap is observed, thus along with an increase in the associated energy thereof, when the ratio $GeSe_2$/$Sb_2Se3$ increases. The gap between the valence band and the conduction band increases. In other words, the band gap value is shifted towards long wavelengths when the proportion of heavy and electron-rich element (Sb) increases.

The characteristic temperatures of the glasses of the second run were determined by DSC analysis. The results are contained in table 5.

TABLE 5

Characteristic temperatures of glasses of second run

| Run | Composition (% molar) | | | Characteristic temperatures | | |
|---|---|---|---|---|---|---|
| x | $GeSe_2$ | $Sb_2Se_3$ | CuI | $T_g$ | $T_x$ | $\Delta T$ |
| 0.3 | 24 | 56 | 20 | 204 | 280 | 76 |
| 0.4 | 32 | 48 | 20 | 206 | 293 | 87 |
| 0.5 | 40 | 40 | 20 | 213 | 285 | 72 |
| 0.6 | 48 | 32 | 20 | 214 | 261 | 47 |

The glass transition temperature $T_g$ varies between 204° C. and 214° C., it increases when the ratio $GeSe_2$/$Sb_2Se_3$ increases. Peak stability is obtained for the composition $32GeSe_2$-$48Sb_2Se_3$-$20CuI$ ($\Delta T=87°$ C.).

The CuI content being constant, the $GeSe_2$ and $Sb_2Se_3$ entities are studied. Note that germanium forms four bonds with selenium and antimony forms three. The higher the germanium content, i.e. $GeSe_2$ entities, the greater the cross-linking of the matrix, the higher the rigidity of the lattice and the higher the thermomechanical properties (the value of $T_g$ is greater).

Example 4

Photoelectric Measurements on Chalcogenide Glass-Ceramics

Photoelectric measurements were made on a plurality of chalcogenide glass-ceramic compositions, including the following composition: $40GeSe_2$-$40Sb_2Se_3$-$20CuI$.

$40GeSe_2$-$40Sb_2Se_3$-$20CuI$ glasses were ceramised for variable times (1 h, 3 h, 6 h and 10 h) at $T_g+50°$ C. (263° C.).

Figure 3:
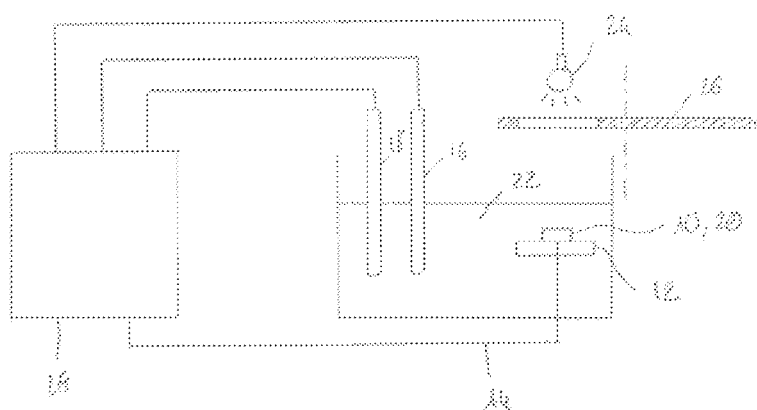
FIG. 3 is a very schematic view of an assembly for measuring the photocurrent generated by a chalcogenide glass-ceramic according to the invention.
Figure 4:
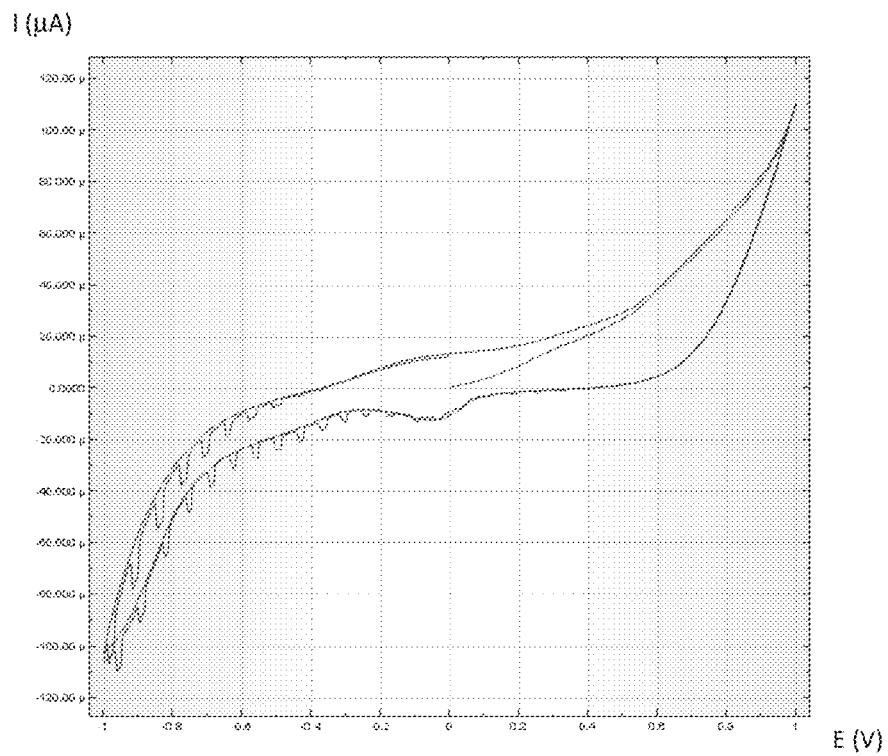
FIGS. 4 to 8 represent photoelectric analysis curves of various samples of chalcogenide glass-ceramics according to the invention, and representing the progression of the current (I) generated in the samples as a function of a potential (E) applied.
Figure 5:
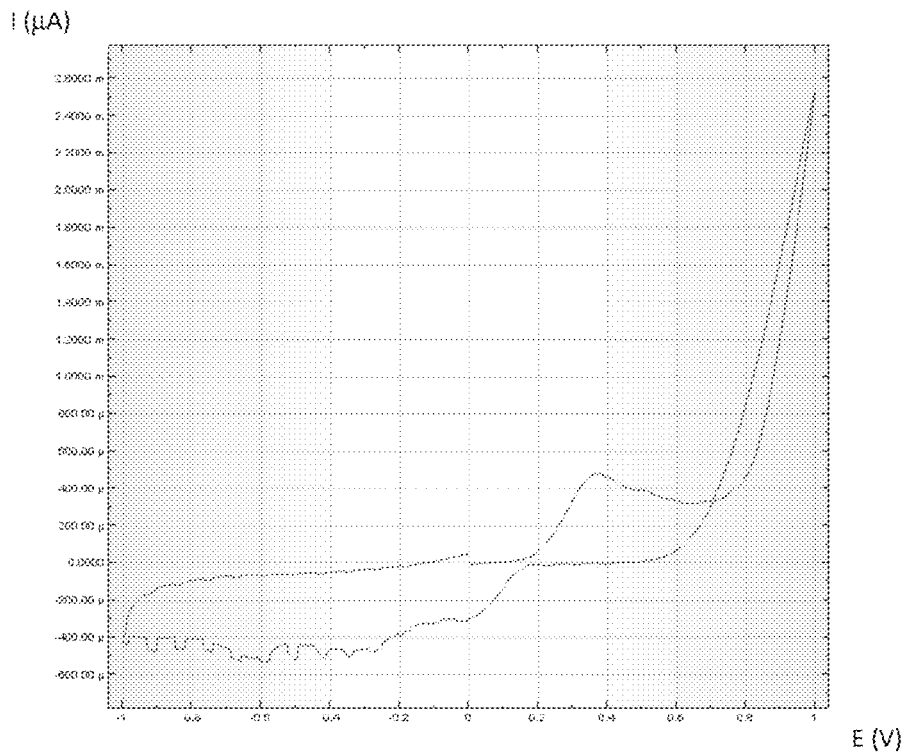
Figure 6:
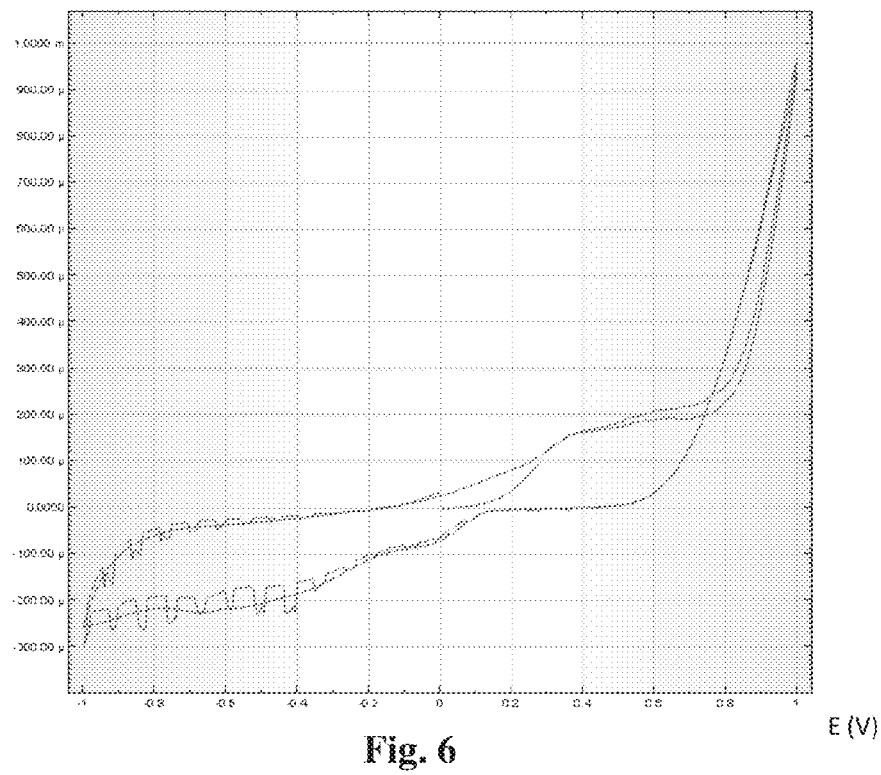
Figure 7:
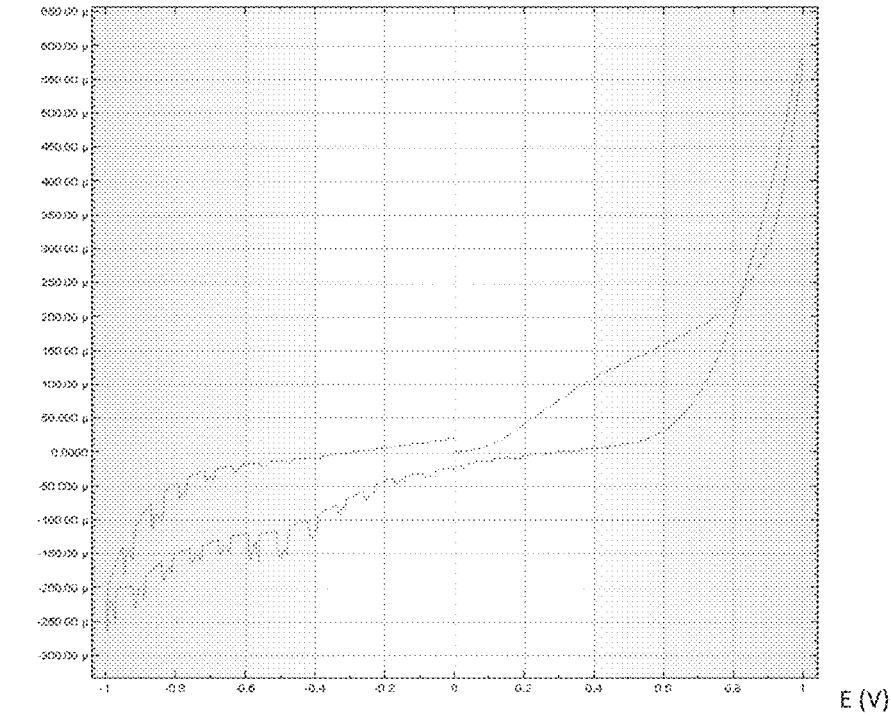

FIG. 3 represents an assembly for measuring the photocurrent generated by these glass-ceramics. Each glass-ceramic 10 was prepared in the form of a chip integrated in an epoxy resin 12 and then polished to obtain a very flat and smooth surface. The photocurrent measurements can be made by means of a contact between a copper wire 14 and the chip. Contact is made using a silver lacquer which is embedded in the resin.

The chip is submerged in a 0.5M $LiClO_4$ solution 22. The photoelectric measurements were using an assembly with three electrodes:

one auxiliary electrode 16 or counter electrode made of Pt, one reference electrode 18 (Ag/AgCl), and one working electrode 20 (the chip 10).

A difference in potential is set and measured between the reference electrode 18 and the working electrode 20, and a current is measured between the auxiliary electrode 16 and the working electrode 20.

During the measurements, the chip is illuminated by a 150 W white light lamp 24 having an illumination intensity of 30 $W/cm^2$. During the cyclic voltammetric measurements, the light was clipped using a rotary blanking disk 26 (called a "chopper"). The measurements were made using an AUTO-LAB METROHM potentiostat connected to the working electrode, and the analysis of the results was performed using NOVA software. The reference 28 in FIG. 3 denotes very schematically the electrical power supply means and the measurement means used. The data were recorded for applied potentials ranging from −1 V to +1 V.

FIGS. 4 to 7 represent the photoelectric analysis curves of the abovementioned ceramised samples (with heat treatment times of 1 h, 3 h, 6 h and 10 h, respectively).

A photocurrent is visible by increasing the absolute value of the current detected when the sample is illuminated. On the abovementioned curves, each photocurrent is characterised by a sudden modification in the current. Due to the repeated interruption of the illumination by the blanking disk 26, the curves comprise a plurality of current jumps giving rise on the curve to a serrated or notched shape, each indentation representing the creation of a photocurrent. The amplitude of this current jump makes it possible to determine the value of the photocurrent (in this case in μA).

When a photocurrent is generated both in the reduction phase and the oxidation phase of the sample (voltammetry curve), this indicates that the sample is n type and p type at the same time. This behaviour is exceptional and may be very useful for designing materials for constructing the p-n junction of a solar cell for example. The doping (m, p, or n and p) of a glass-ceramic according to the invention may also be determined using the Van der Pauw method, which is known to those skilled in the art.

Table 6 contains the various n and p type photocurrent values as a function of the ceramisation time of a glass having the composition $40GeSe_2$-$40Sb_2Se_3$-$20CuI$. The intensity of this photocurrent may be dependent on a number of parameters such as conductivity, sample thickness and the number of charge carriers created under illumination.

TABLE 6

P and n type photocurrent values as a function of ceramisation time

| $40GeSe_2$—$40Sb_2Se_3$—$20CuI$ | Photocurrent (μA) | |
|---|---|---|
| Ceramisation time | p | n |
| 1 h | 5 | 0 |
| 3 h | 60 | 8 |
| 6 h | 70 | 2 |
| 10 h | 40 | 2 |

From one hour of ceramisation, a p type photocurrent may be observed. From 3 hours, a weak n-type current appears in the glass. The value of the p type photocurrent increases rapidly and varies between 5 μA and 70 μA (the latter value being very important for this type of material). The n type photocurrent remains relatively weak and does not exceed 10 μA. The p type photocurrent appears to reach a maximum value after 6 hours of ceramisation.

Moreover, it can be observed that the photocurrent is stable over time.

Figure 8:
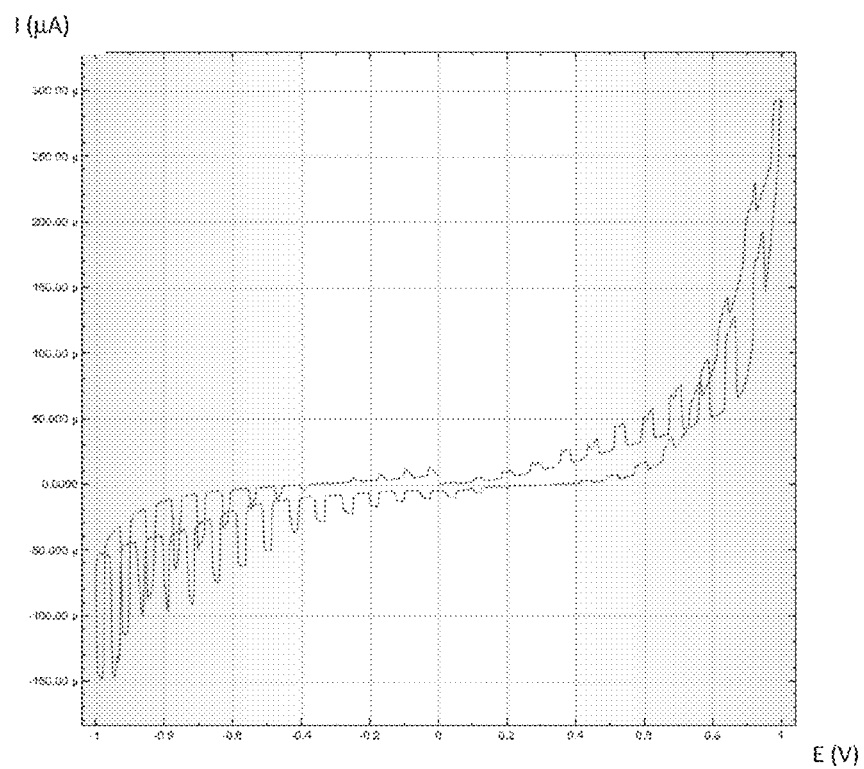

A further sample having the composition $40GeSe_2$-$40Sb_2Se_3$-$20CuI$ ceramised for 6 hours at $T_g+50°$ C. was measured. It was previously polished after ceramisation, before being included in a resin. FIG. 8 represents the photoelectric analysis curve of this sample. A high increase in the n type photocurrent (40 μA) compared to the unpolished sample (FIG. 6) is then noted. The p type photocurrent decreases slightly (55 μA). It may thus be inferred that the surface ceramisation and the ceramisation inside the glass are different, which has an influence on the photoelectric effect of the glass. Scanning electron microscopic analyses were then conducted on the glass having the composition $40GeSe_2$-$40Sb_2Se_3$-$20CuI$.

Figure 9:
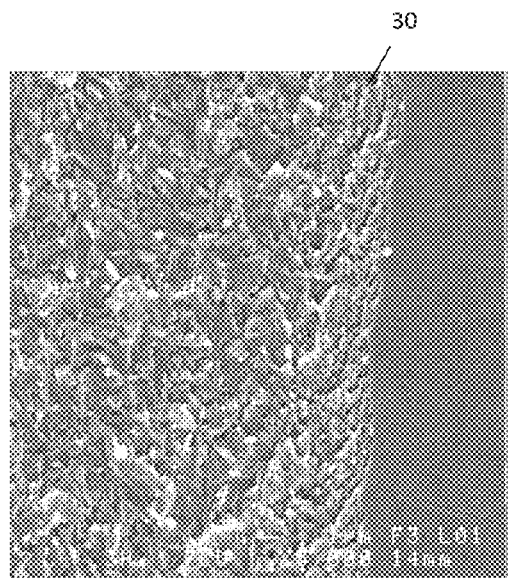
FIGS. 9 and 10 are SEM images of two chalcogenide glass-ceramics according to the invention.
Figure 10:
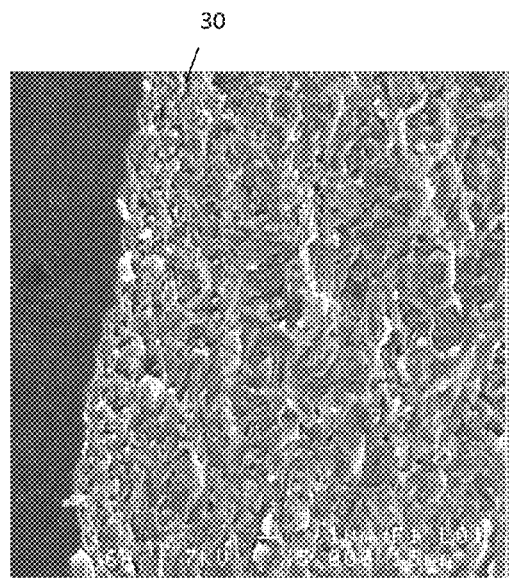

Samples having the composition $40GeSe_2$-$40Sb_2Se_3$-$20CuI$ ceramised for 3 hours and 6 hours at $T_g+50°$ C. (263° C.) were analysed by scanning electron microscopy. On the samples in chip form, an impact was made on the surface thereof in order to observe the crystals over a few microns in depth. FIGS. 9 and 10 respectively represent the SEM images of the samples ceramised for 3 hours and 6 hours. The images were obtained using a JEOL JSM 6301F field emission scanning electron microscope.

The presence of a thin layer 30 can be observed on the surface of the two samples where the size of the crystals seems to be smaller. This thin layer could explain the difference in the photocurrent measurements between the polished and unpolished sample.

The SEM images were compared to further SEM images of glass-ceramics for which the heat treatment times and crystallisation rates were different. These comparisons made it possible to demonstrate, on one hand, that the crystallisation rate and the size of the crystals have an influence on the conductivity and the photoelectric properties of the glass-ceramics, and, on the other, that the proximity and preferably the contact between the crystals were important to ensure satisfactory photoelectric properties for the glass-ceramics, as explained above.

The EDS-SEM analysis further made it possible to determine the composition at the centre of the glass. The inventors also tried to determine whether there was a difference in composition between the edges of the glasses and the centre of the sample.

The compositions of the samples were determined by microanalysis using an OXFORD LINK ISIS energy dispersion spectrometer (EDS), installed on the JEOL JSM 6400 scanning electron microscope. This apparatus enables the detection of elements wherein the atomic number is greater than that of beryllium (Z=4), over a depth of approximately 3 μm. For the analysis, the sample is previously prepared: a piece of glass is included in an acrylic resin. The sample is then polished on SiC abrasive cards of decreasing grain size (1200 and 1200/4000 mesh) and then on 1 μm alumina powder.

Tables 7 and 8 respectively contain the various measured atomic compositions of the samples ceramised for 3 hours and 6 hours at $T_g+50°$ C. Results 1 to 9 represent the measurement points, moving from the edge of the sample, over a distance of approximately 30 μm.

It is observed that the composition of our sample and the theoretical composition are overall the same. No major difference between the composition at the centre of our glass and that at the edge of the sample is observed. The difference in photocurrent values between the unpolished and polished samples thus does not appear to be explained by the variation of composition between the centre and the edge of the glass. This difference could be explained by the fact that the larger crystals, at the centre of the glass-ceramic, are more readily in contact with each other and represent a greater percentage by volume, than the smaller crystals at the edge of the glass-ceramic.

electric measurements were made on the compositions $40SnSe_2$-$40Sb_2Se_3$-$20CuI$ and $40PbSe_2$-$40Sb_2Se_3$-$20CuI$.

The glasses were synthesised using the sealed tube method. After annealing, the samples obtained were completely ($40PbSe_2$-$40Sb_2Se_3$-$20CuI$) or partially ($40SnSe_2$-$40Sb_2Se_3$-$20CuI$) crystallised. Each of these samples was polished and included in resin in order to carry out the photocurrent measurements.

Figure 12:
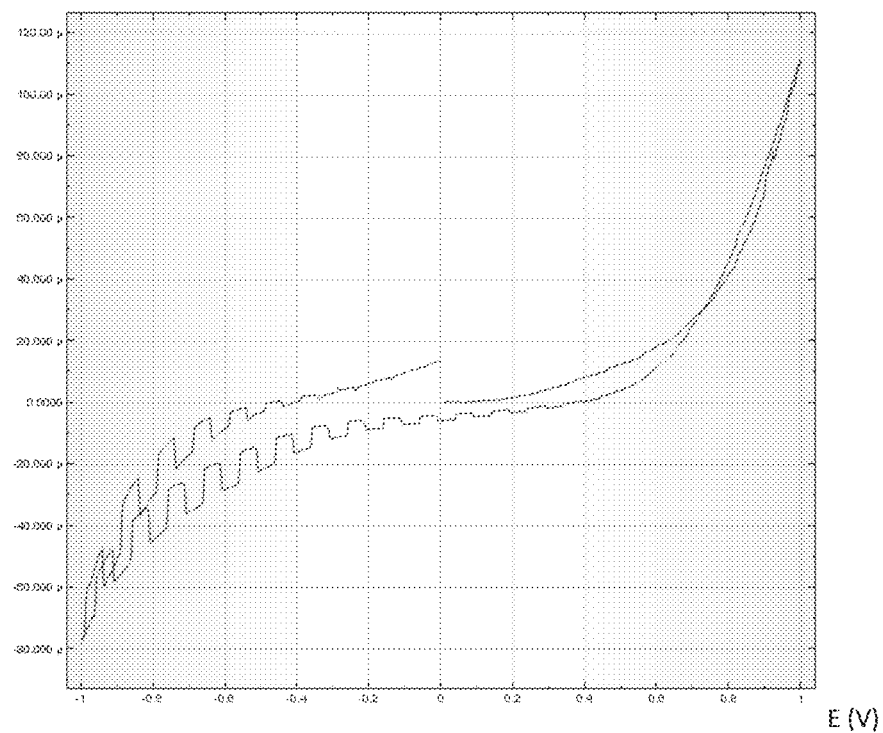

Photoelectric measurements were made on the sample having the composition $40SnSe_2$-$40Sb_2Se_3$-$20CuI$. FIG. 12 represents the photoelectric analysis curve. A p type photocurrent of approximately 10 μA and an n type photocurrent of approximately 3 μA are observed.

Figure 13:
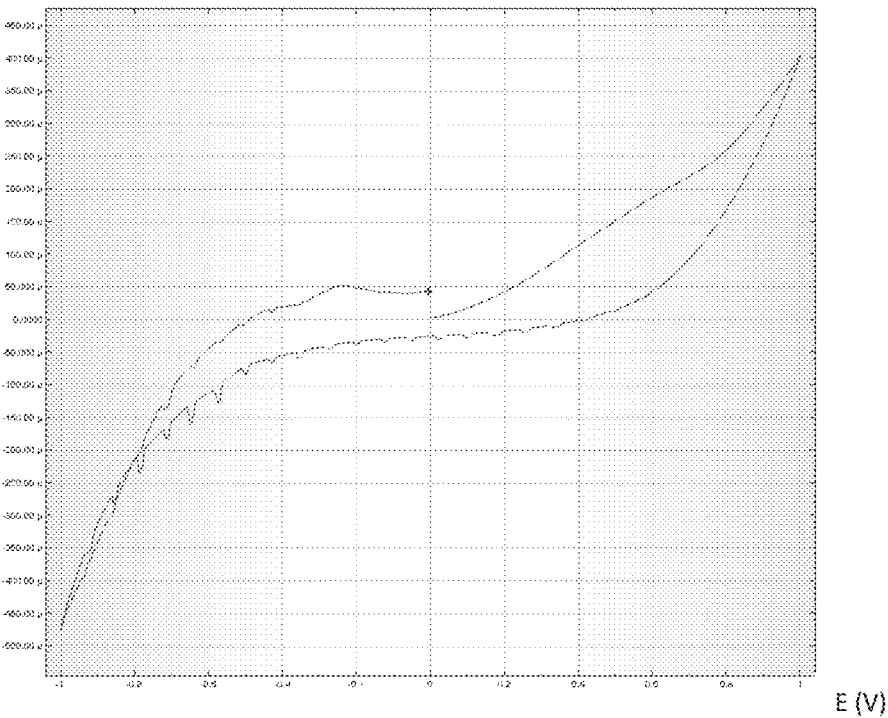

FIG. 13 represents the photoelectric analysis curve of the sample having the composition $40PbSe_2$-$40Sb_2Se_3$-$20CuI$. A p type photocurrent of approximately 15 μA can be observed.

Example 6

Study of Glass-Ceramics Having the Composition $40GeSe_2$-$40As_2Se_3$-$20CuI$

Further glasses having the composition $40GeSe_2$-$40As_2Se_3$-$20CuI$ were tested and photoelectric measure-

TABLE 7

Atomic compositions of 40GeSe2—40Sb2Se3—20CuI glass ceramised for 3 hours
$40GeSe_2$—$40Sb_2Se_3$—$20CuI$ ceramised 3 h at $T_g + 50°$ C.

| | | | Composition (atomic %) | | | | | | | | |
|---|---|---|---|---|---|---|---|---|---|---|---|
| Element | Theoretical | Centre | 1 | 2 | 3 | 4 | 5 | 6 | 7 | 8 | 9 |
| Cu | 5.56 | 5.47 | 3.29 | 2.74 | 4.7 | 4.08 | 2.46 | 4.4 | 2.96 | 6.62 | 4.5 |
| Ge | 11.11 | 11.88 | 11.28 | 10.93 | 11.42 | 11.18 | 12.22 | 11.02 | 11.83 | 11.78 | 11.42 |
| Se | 55.56 | 4.44 | 55.76 | 55.48 | 55.13 | 55.78 | 56.07 | 56.07 | 55.27 | 54.37 | 55.29 |
| Sb | 22.22 | 22.91 | 23.53 | 24.69 | 23.03 | 23.35 | 23.83 | 22.81 | 23.54 | 22.43 | 23.36 |
| I | 5.56 | 5.3 | 6.14 | 6.16 | 5.71 | 5.61 | 5.41 | 5.71 | 6.41 | 4.8 | 5.42 |

TABLE 8

Atomic compositions of 40GeSe2—40Sb2Se3—20CuI glass ceramised for 6 hours
$40GeSe_2$—$40Sb_2Se_3$—$20CuI$ ceramised for 6 h at $T_g + 50°$ C.

| | | | Composition (atomic %) | | | | | | | | |
|---|---|---|---|---|---|---|---|---|---|---|---|
| Element | Theoretical | Centre | 1 | 2 | 3 | 4 | 5 | 6 | 7 | 8 | 9 |
| Cu | 5.56 | 5.47 | 4.62 | 6.03 | 6.19 | 5.12 | 8.09 | 5.67 | 8.66 | 5.7 | 3.7 |
| Ge | 11.11 | 11.88 | 12.17 | 10.79 | 11.89 | 11.72 | 11.06 | 11.81 | 10.79 | 11.56 | 12.32 |
| Se | 55.56 | 4.44 | 54.11 | 55.5 | 54.34 | 54.17 | 53.89 | 54.61 | 54.22 | 54.30 | 54.64 |
| Sb | 22.22 | 22.91 | 23.3 | 22.41 | 22.61 | 23.71 | 22.45 | 23.33 | 21.72 | 23.34 | 23.72 |
| I | 5.56 | 5.3 | 5.8 | 5.27 | 4.97 | 5.28 | 4.52 | 4.57 | 4.62 | 5.1 | 5.62 |

Figure 11:
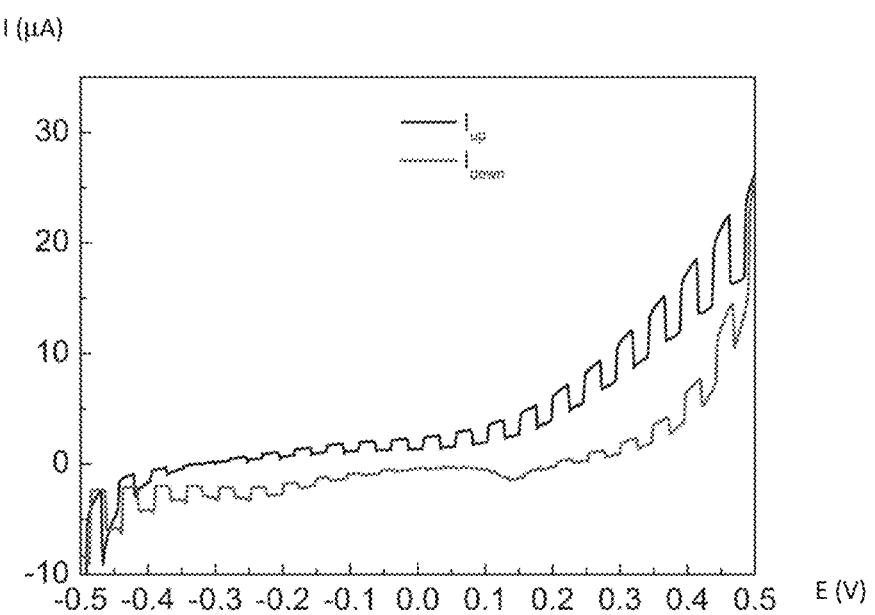
FIGS. 11 to 25 represent photoelectric analysis curves of further samples of chalcogenide glass-ceramics according to the invention.

FIG. 11 represents the photoelectric analysis curve of a further sample having the composition 40GeSe2-40Sb2Se3-20CuI ceramised at 290° C. for 5 hours. It is noted that the glass-ceramic is suitable for producing a relatively stable photocurrent under illumination.

Example 5

Study of Glass-Ceramics Having the Composition $40MSe_2$-$40Sb_2Se_3$-$20CuI$

Further glasses having the composition $40MSe_2$-$40Sb_2Se_3$-$20CuI$ were tested, where M is Sn or Pb. Photoments were made on these glasses after heat treatments of various durations. Table 9 contains the various n and p type photocurrent values as a function of the ceramisation time.

TABLE 9

P and n type photocurrent values as a function of ceramisation time

Figure 14:
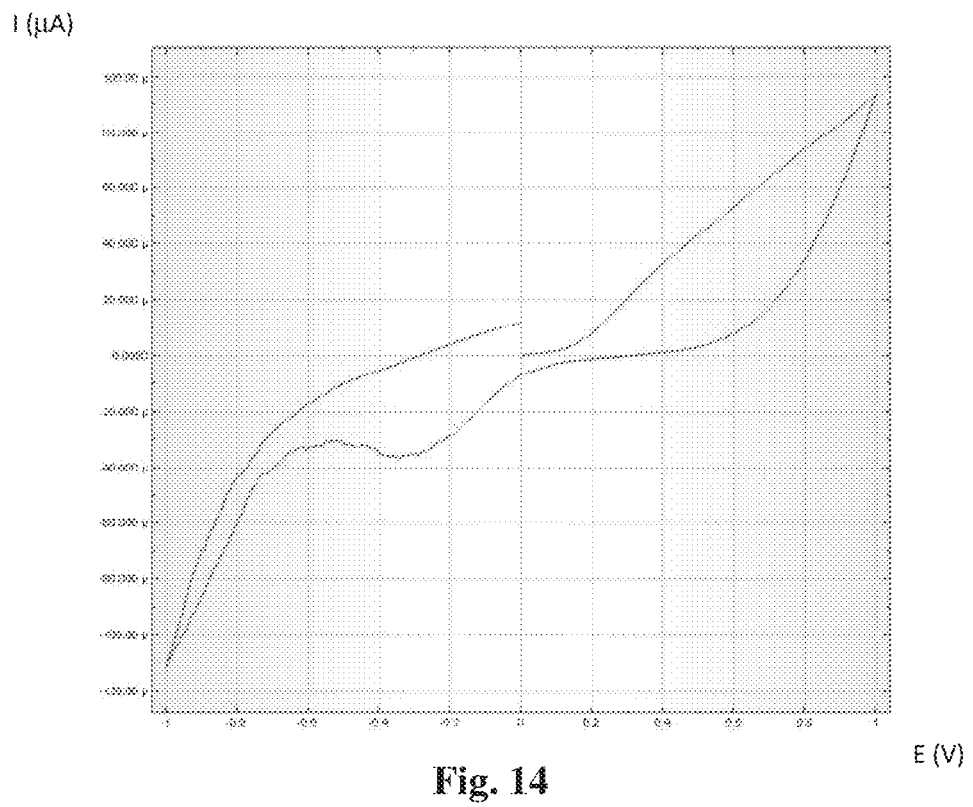
Figure 15:
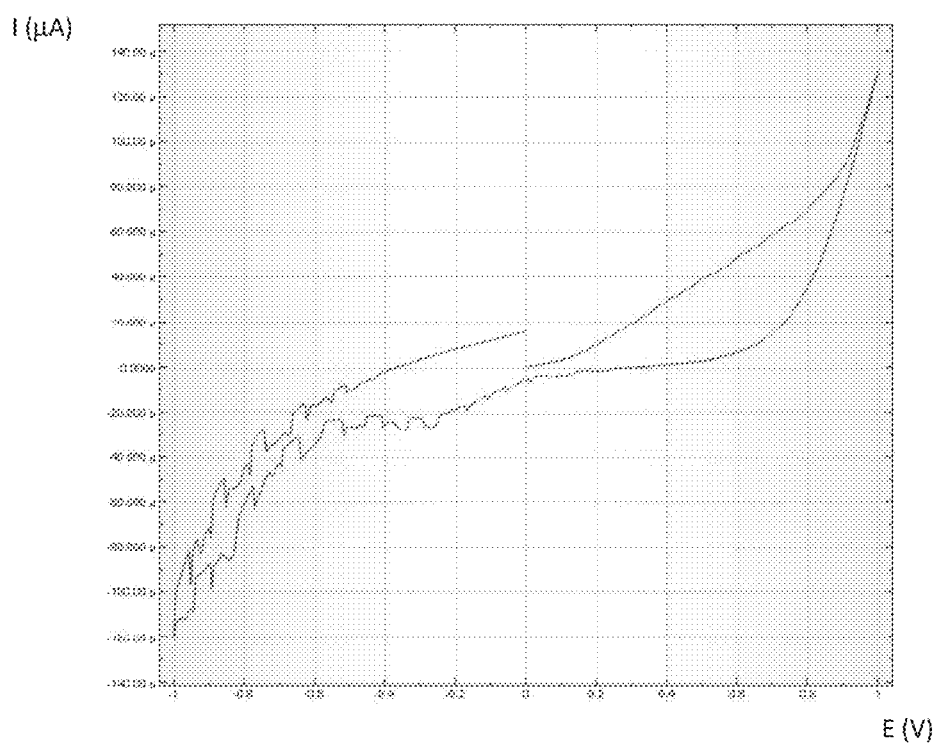
Figure 16:
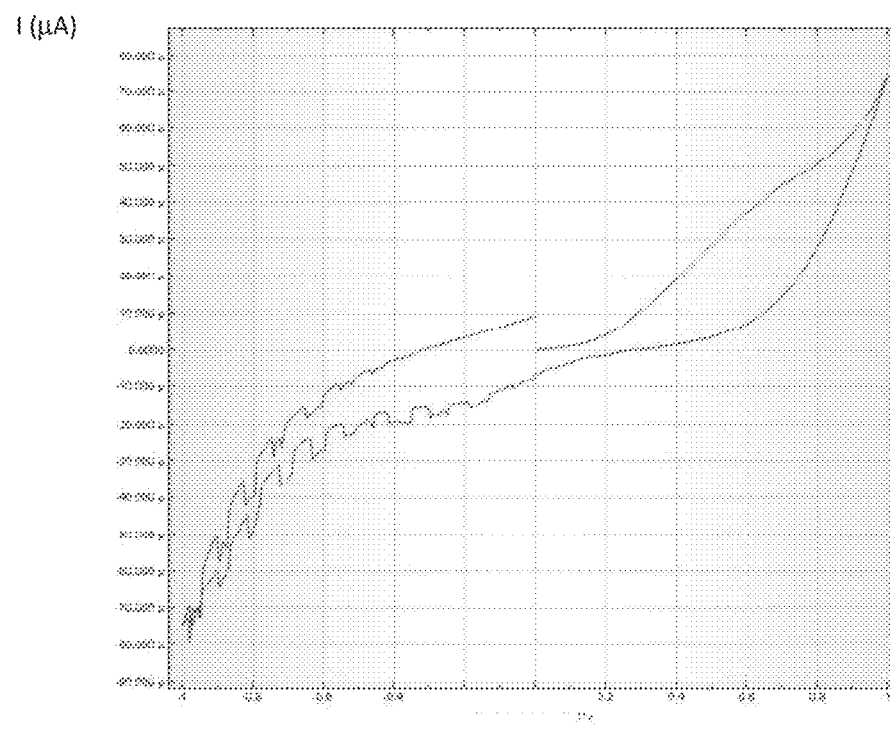

| $40GeSe_2$—$40As_2Se_3$—$20CuI$ With no resin or blanking disk | Photocurrent (μA) | |
|---|---|---|
| Ceramisation time (Tg + 50° C.) | p | n |
| 1 h (FIG. 14) | 2 | 0 |
| 2 h (FIG. 15) | 8 | 0 |
| 3 h (FIG. 16) | 8 | 0 |

TABLE 9-continued

P and n type photocurrent values as a function of ceramisation time

Figure 17:
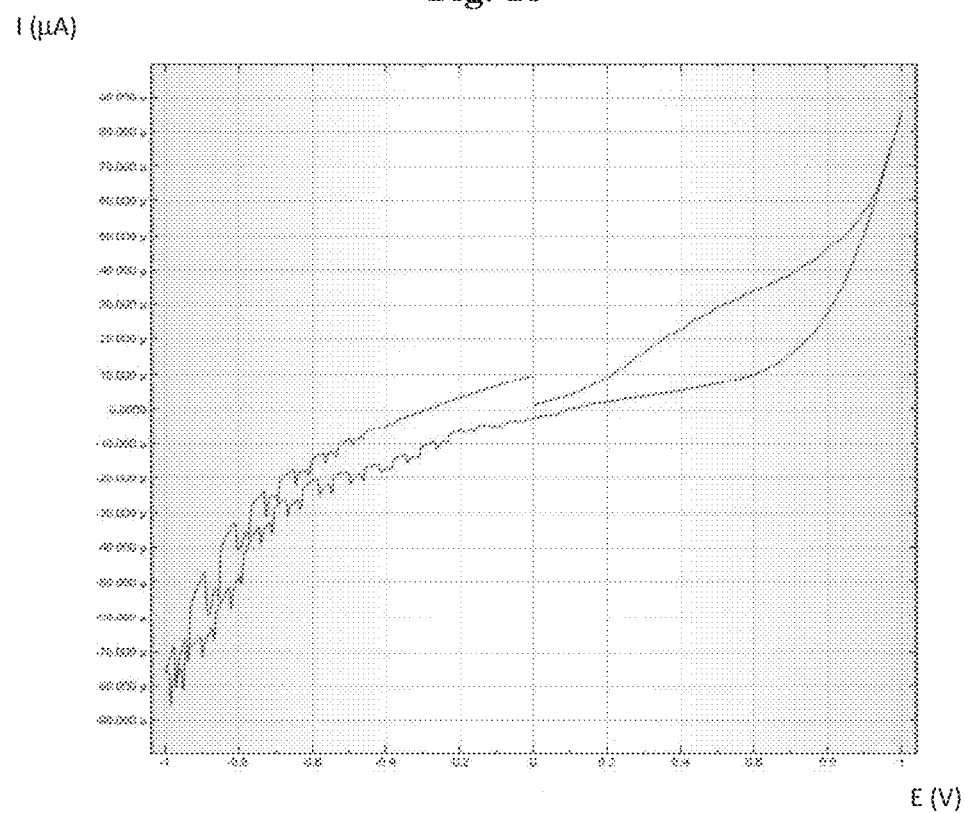
Figure 18:
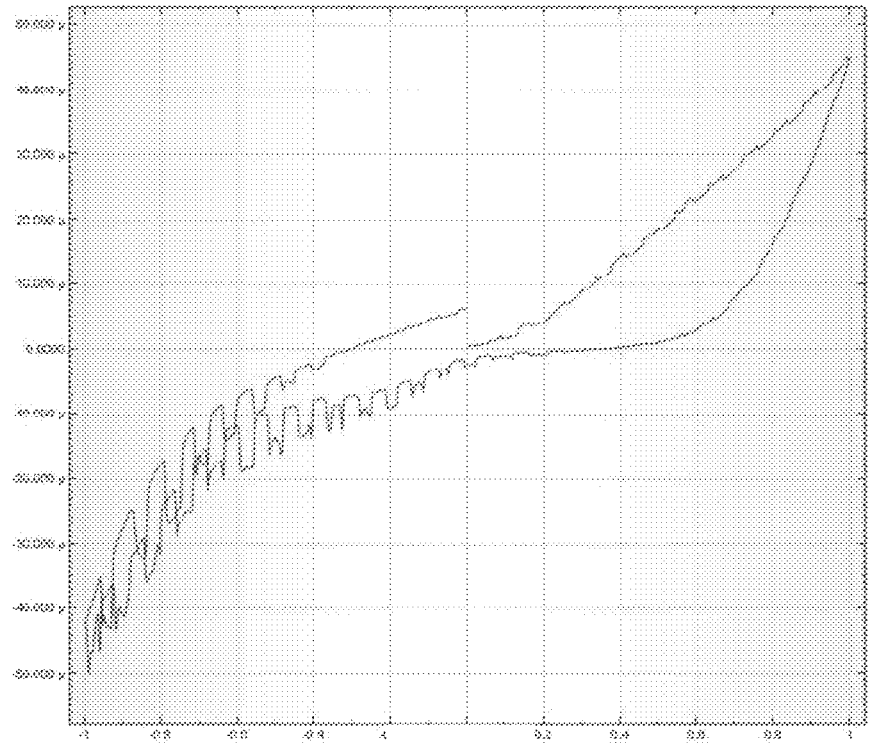
Figure 19:
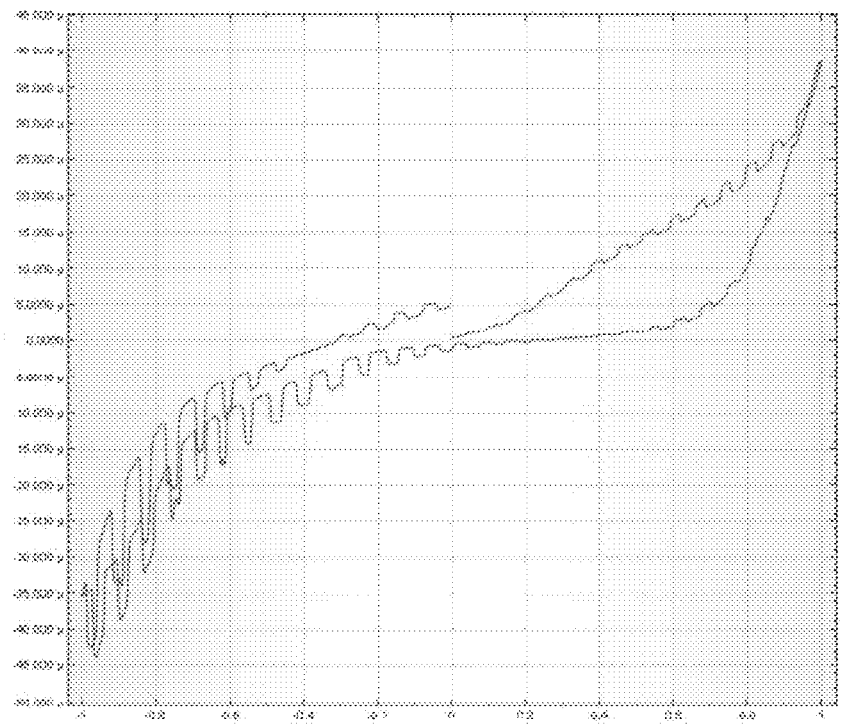
Figure 20:
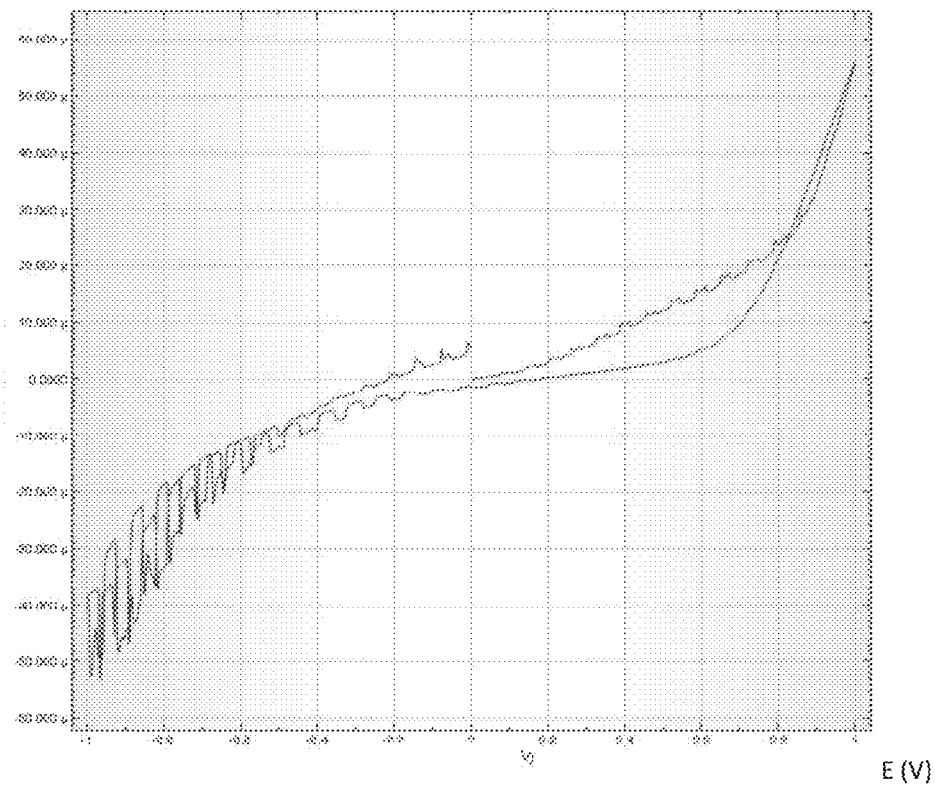
Figure 21:
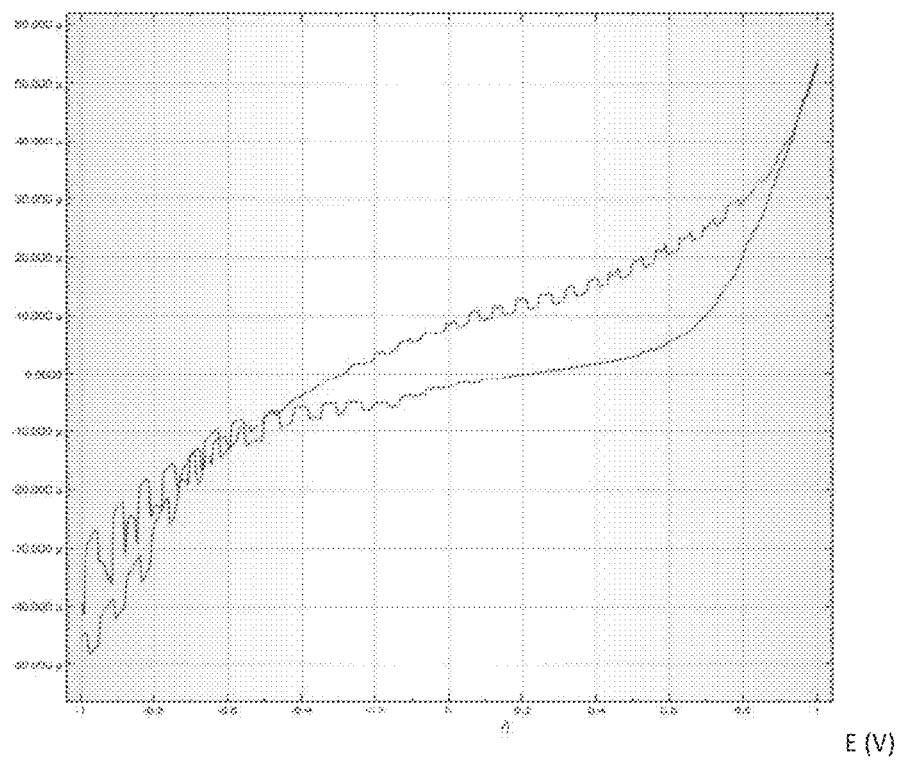
Figure 22:
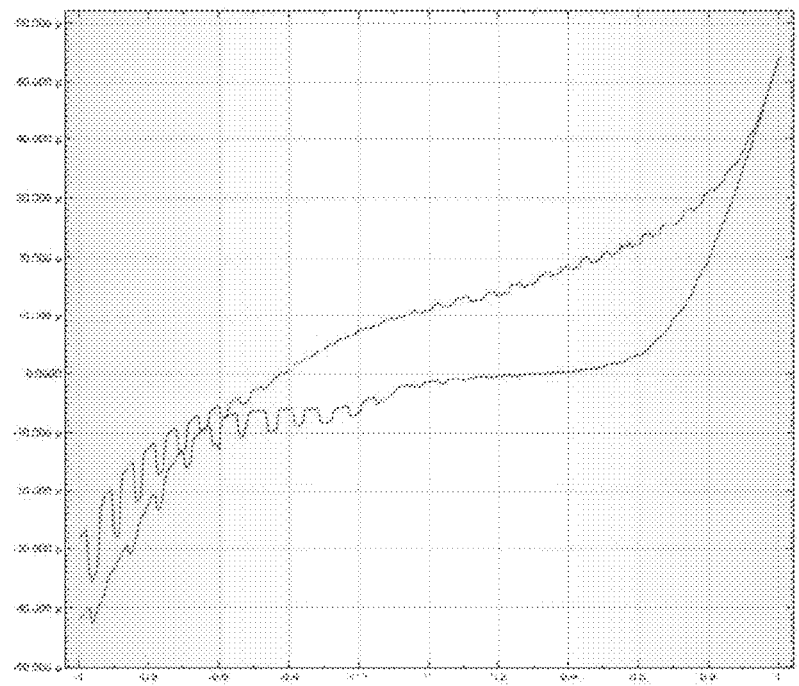
Figure 23:
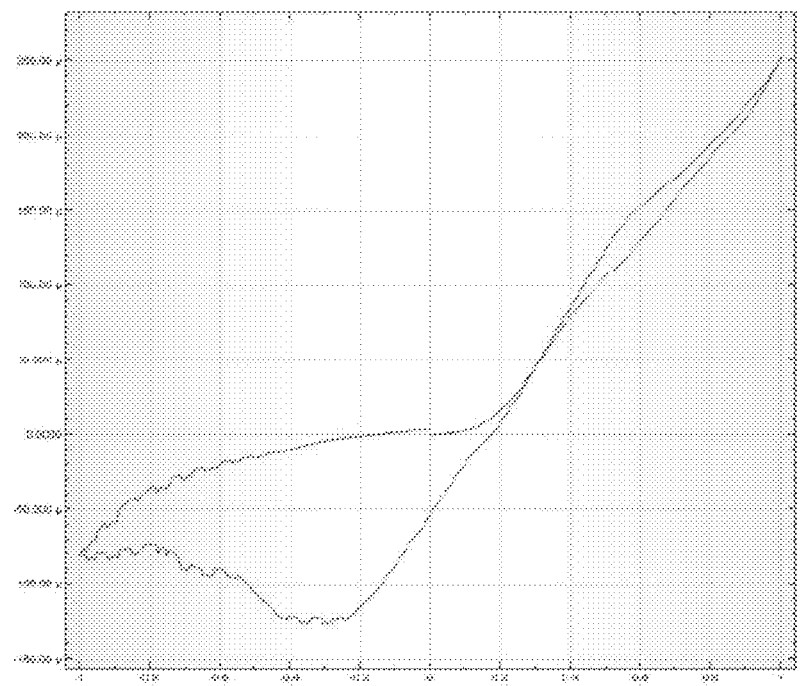
Figure 24:
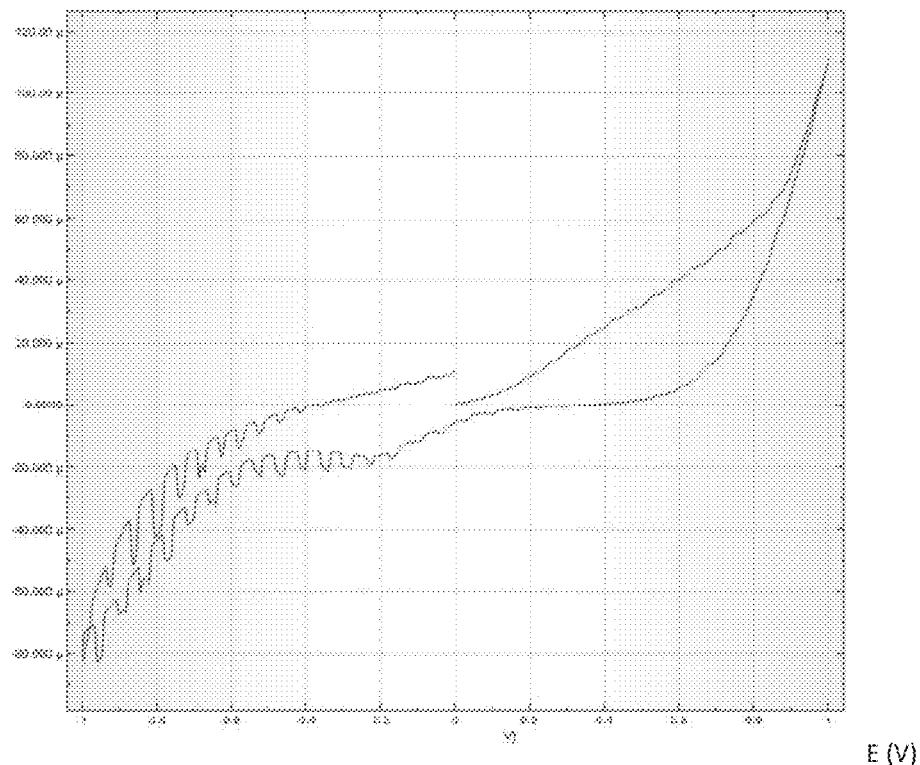
Figure 25:
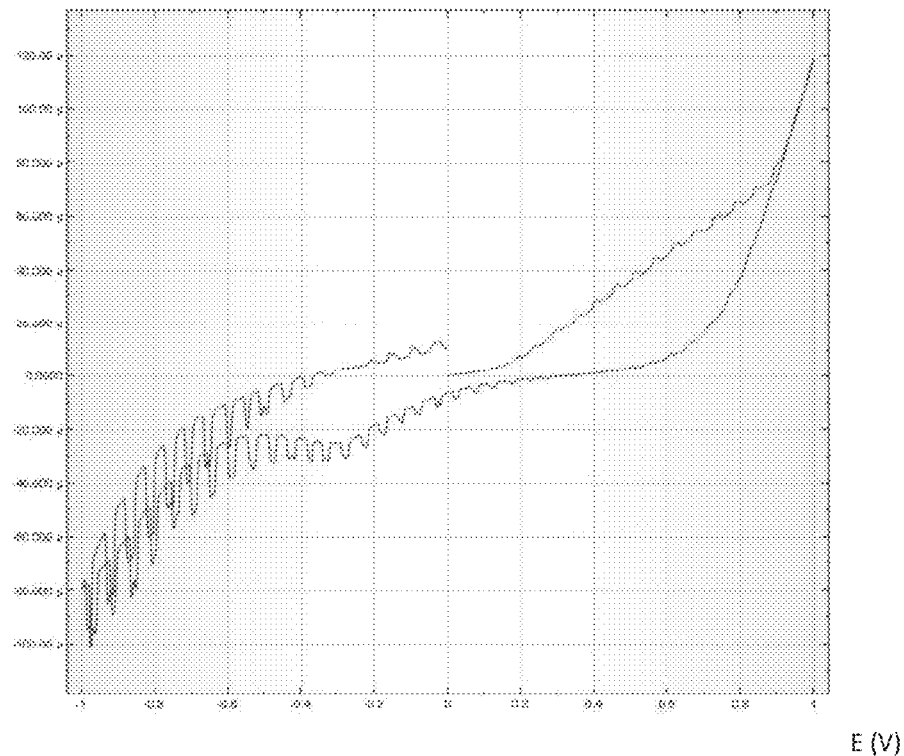

| 40GeSe$_2$—40As$_2$Se$_3$—20CuI With no resin or blanking disk | Photocurrent (µA) | |
|---|---|---|
| Ceramisation time (Tg + 50° C.) | p | n |
| 4 h (FIG. 17) | 6 | 1 |
| 5 h (FIG. 18) | 10 | 2 |
| 6 h (FIG. 19) | 8 | 2 |
| 7 h (FIG. 20) | 10 | 2 |
| 8 h (FIG. 21) | 8 | 2 |
| 9 h (FIG. 22) | 6 | 2 |
| 10 h (FIG. 23) | 2 | 0 |
| 12 h (FIG. 24) | 15 | 2 |
| 15 h (FIG. 25) | 25 | 3 |

From one hour of ceramisation, a p type photocurrent can be observed. From 4 hours, a low n type current appears in the glass. The p type photocurrent value varies between 2 µA and 25 µA. The n type photocurrent remains relatively low and does not exceed 3 µA.

Example 7

Further Chalcogenide Glass-Ceramic Compositions Tested

Further chalcogenide glass-ceramic compositions were tested so as to determine the thermal conductivity thereof and the ability thereof to generate a photocurrent. The compositions tested are indicated in the following tables.

TABLE 10

Chalcogenide glass-ceramic compositions tested to determine thermal conductivity and ability to generate a photocurrent

| General composition | | | Elemental composition | | | | |
|---|---|---|---|---|---|---|---|
| GeSe2 | Sb2Se3 | CuI | Ge | Sb | Se | Cu | I |
| 50 | 50 | 0 | 50 | 100 | 250 | 0 | 0 |
| 45 | 45 | 10 | 45 | 90 | 225 | 10 | 10 |
| 40 | 40 | 20 | 40 | 80 | 200 | 20 | 20 |
| 35 | 35 | 30 | 35 | 70 | 175 | 30 | 30 |
| 16 | 64 | 20 | 16 | 128 | 224 | 20 | 20 |
| 24 | 56 | 20 | 24 | 112 | 216 | 20 | 20 |
| 32 | 48 | 20 | 32 | 96 | 208 | 20 | 20 |
| 48 | 32 | 20 | 48 | 64 | 192 | 20 | 20 |
| 18 | 72 | 10 | 18 | 144 | 252 | 10 | 10 |
| 27 | 63 | 10 | 27 | 126 | 243 | 10 | 10 |
| 63 | 27 | 10 | 63 | 54 | 207 | 10 | 10 |
| 72 | 18 | 10 | 72 | 36 | 198 | 10 | 10 |
| 21 | 49 | 30 | 21 | 98 | 189 | 30 | 30 |
| 42 | 28 | 30 | 42 | 56 | 168 | 30 | 30 |
| 30 | 30 | 40 | 30 | 60 | 150 | 40 | 40 |
| 25 | 25 | 50 | 25 | 50 | 125 | 50 | 50 |
| GeSe2 | Sb2Se3 | CuI | Ge | Sb | Se | Cu | Br |
| 40 | 40 | 20 | 40 | 80 | 200 | 20 | 20 |
| GeSe2 | Sb2Se3 | CuI | Ge | Sb | Se | Cu | Cl |
| 40 | 40 | 20 | 40 | 80 | 200 | 20 | 20 |
| SnSe2 | Sb2Se3 | CuI | Ge | Sb | Se | Cu | I |
| 40 | 40 | 20 | 40 | 80 | 200 | 20 | 20 |
| PbSe2 | Sb2Se3 | CuI | Ge | Sb | Se | Cu | I |
| 40 | 40 | 20 | 40 | 80 | 200 | 20 | 20 |
| GeSe2 | As2Se3 | CuI | Ge | Sb | Se | Cu | I |
| 40 | 40 | 20 | 40 | 80 | 200 | 20 | 20 |
| GeSe2 | In2Se3 | CuI | Ge | In | Se | Cu | I |
| 40 | 40 | 20 | 40 | 80 | 200 | 20 | 20 |
| GeSe2 | Bi2Se3 | CuI | Ge | In | Se | Cu | I |
| 40 | 40 | 20 | 40 | 80 | 200 | 20 | 20 |
| GeTe2 | Sb2Te3 | CuI | Ge | Sb | Te | Cu | I |
| 40 | 40 | 20 | 40 | 80 | 200 | 20 | 20 |
| GeSe2 | Sb2Te3 | CuI | Ge | Sb | Te | Se | Cu | I |
| 40 | 40 | 20 | 40 | 80 | 120 | 80 | 20 | 20 |

Table 11 shows the resistance and the electrical conductivity of some of the composition mentioned above.

TABLE 11

Resistance and electrical conductivity of chalcogenide glass-ceramics

| Composition | R (Ω) | Conductivity (Ω$^{-1}$ · cm$^{-1}$) |
|---|---|---|
| 40GeSe2—40Bi2Se3—20CuI | 0.0759177 | 69.6939619 |
| 40GeTe2—40Sb2Te3—20CuI | 0.00362592 | 1421.608633 |
| 40GeSe2—40Sb2Te3—20CuI | 0.04328442 | 141.7362027 |

The inventors observed that the composition of the chalcogenide glass-ceramics has an influence on their electrical conductivity and their ability to generate a photocurrent under illumination. Moreover, they observed that the requirement in respect of contact or low proximity between the glass-ceramic crystals was significant for generating a photocurrent. The duration of the heat treatment and the crystallisation rate of the glass-ceramics may be different according to the compositions in question, in order to create at least one crystalline phase comprising crystals in contact with each other.

Examples of Application of Chalcogenide Glass-Ceramics

The chalcogenide glass-ceramics according to the invention may be used for producing electricity by means of the photovoltaic effect (photodiode, a photovoltaic cell), or for decomposing or processing a chemical or biological substance by means of the photocatalytic effect. In the latter case, the glass-ceramics may be used for decomposing pollutants, generating hydrogen by means of water decomposition, reducing $CO_2$, etc.

In order to enhance the photocatalytic properties of a glass-ceramic, it is possible to increase the specific surface area of this glass-ceramic. For this, two methods may be used. The first consists of grinding the glass-ceramic so as to obtain a powder having a grain size less than 100 nm. The second method consists of selective chemical etching, on the glass-ceramic surface, making use of the difference in solubility of the crystalline phases and the vitreous phase, making it possible to increase the specific surface area thereof for example by a factor of approximately 7000.

Having described the invention, the following is claimed:

1. A chalcogenide glass-ceramic, comprising:
   at least one crystalline phase; and
   a composition comprising, as a molar %,

| | |
|---|---|
| Ge + Sn + Pb | 3-25 |
| Sb + In + As + Bi | 10-35 |
| Se + Te | 40-65 |
| M | 2-17 |
| X | 2-17 | where M is Cu, X is a halogen, and a sum of all the molar percentages of the composition is equal to 100,
wherein a crystallisation rate in the crystalline phase and dimensions of crystals in the crystalline phase are such that the crystals are substantially in contact with each other,
wherein the crystallisation rate in the crystalline phase and the dimensions of the crystals in the crystalline phase are such that the crystalline phase has an electrical conductivity greater than or equal to $10^{-4}$ s·cm$^{-1}$, and
wherein the electrical conductivity increases under lighting due to a creation of charge carriers within the crystalline phase.

2. The glass-ceramic according to claim 1, wherein the composition is selected from the group consisting of GeSe$_2$—Sb$_2$Se$_3$—CuI, SnSe$_2$—Sb$_2$Se$_3$—CuI, PbSe$_2$—Sb$_2$Se$_3$—CuI, GeSe$_2$—As$_2$Se$_3$—CuI, GeSe$_2$—In$_2$Se$_3$—CuI, GeSe$_2$—Bi$_2$Se$_3$—CuI, GeTe$_2$—Sb$_2$Se$_3$—CuI, GeSe$_2$—Sb$_2$Se$_3$—CuCl, and GeSe$_2$—Sb$_2$Se$_3$—CuBr.

3. The glass-ceramic according to claim 1, wherein the composition comprises, as a molar %,

| | |
|---|---|
| Ge | 3-25 |
| Sb | 10-35 |
| Se | 40-65 |
| Cu | 2-17 |
| I | 2-17 | where the sum of all the molar percentages of the composition being equal to 100.

4. The glass-ceramic according to claim 1, wherein the composition is free from one or more elements selected from the group consisting of Ga, S, Cs, Zn, Cd, Rb, Na, K, B and La.

5. The glass-ceramic according to claim 1, wherein the composition is GeSe$_2$—Sb$_2$Se$_3$—CuI, and
   wherein the respective molar percentages of the composition are:

| | |
|---|---|
| GeSe$_2$ | 30-50 |
| Sb$_2$Se$_3$ | 30-50 |
| CuI | 10-30. |

6. The glass-ceramic according to claim 1, wherein the charge carriers created within the crystalline phase generate one or more photocurrents selected from the group consisting of a p-type photocurrent, a n-type photocurrent, and a p-and-n-type photocurrent.

7. The glass-ceramic according to claim 1, wherein the crystallisation rate of the crystalline phase is greater than 50% in volume.

8. A method for producing a glass-ceramic, from a chalcogenide glass wherein the composition comprises, as a molar %,

| | |
|---|---|
| Ge + Sn + Pb | 3-25 |
| Sb + In + As + Bi | 10-35 |
| Se + Te | 40-65 |
| M | 2-17 |
| X | 2-17 | wherein M is a transition metal such as Cu and X is a halogen such as I, Cl or Br, and the sum of all the molar percentages of the composition is equal to 100,
said method comprising:
   subjecting the glass to a heat treatment a duration and time whereof are determined to create at least one crystalline phase in the glass, the crystallisation rate and the dimensions of at least some crystals of the crystalline phase being such that the crystals are substantially in contact with each other in such a way that this crystalline phase has an electrical conductivity greater than $10^{-4}$ s·cm$^{-1}$, which increases under lighting due to the creation of charge carriers within the crystalline phase.

9. The method according to claim 8, further comprising one or more of the following additional steps:
   i) selective chemical etching of the glass-ceramic with a view to increasing a specific surface area thereof; and
   ii) grinding of the glass-ceramic to increase the specific surface area thereof.

10. The method according to claim 8, wherein the duration of the heat treatment is between 1 and 10 hours, and/or a temperature of the heat treatment is greater by more than 10° C. than a glass transition temperature of the glass.

11. The method according to claim 8, wherein the duration of the heat treatment is greater than 1 hour so that the crystalline phase can generate a p and n type photocurrent.

12. A product chosen from a photovoltaic cell, means for decomposing or processing a chemical or biological substance, wherein the product comprises at least one glass-ceramic according to claim 1.

13. The glass-ceramic according to claim 1, wherein the composition is GeSe$_2$—Sb$_2$Se$_3$—CuI, and
   wherein the respective molar percentages of the composition are:

| | |
|---|---|
| GeSe$_2$ | 35-45 |
| Sb$_2$Se$_3$ | 35-45 |
| CuI | 15-25. |

14. The glass-ceramic according to claim 13, wherein the respective molar percentages of the GeSe$_2$—Sb$_2$Se$_3$—CuI composition are:

| | |
|---|---|
| GeSe$_2$ | 40 |
| Sb$_2$Se$_3$ | 40 |
| CuI | 20. |

15. The glass-ceramic according to claim 1, wherein the crystalline rate of the crystalline phase is greater than 70% in volume.

16. The glass-ceramic according to claim 1, wherein the crystalline rate of the crystalline phase is greater than or equal to 80% in volume.

17. The glass-ceramic according to claim 1, wherein the halogen is selected from the group consisting of I, Cl, and Br.

18. The glass-ceramic according to claim 1, wherein the halogen is I.

19. The glass-ceramic according to claim 1, wherein the composition is $GeSe_2$—$Sb_2Se_3$—$CuI$.

* * * * *